(12) United States Patent
Cho et al.

(10) Patent No.: US 9,431,578 B2
(45) Date of Patent: Aug. 30, 2016

(54) SEMICONDUCTOR LIGHT EMITTING DEVICES

(71) Applicant: Samsung Electronics Co., Ltd., Suwon-Si, Gyeonggi-Do (KR)

(72) Inventors: Myong Soo Cho, Yongin-si (KR); Tae Hun Kim, Anyang-si (KR); Young Ho Ryu, Suwon-si (KR); Young Chul Shin, Yongin-si (KR); Dong Myung Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 22 days.

(21) Appl. No.: 14/152,128

(22) Filed: Jan. 10, 2014

(65) Prior Publication Data
US 2014/0209956 A1 Jul. 31, 2014

(30) Foreign Application Priority Data
Jan. 31, 2013 (KR) .................. 10-2013-0011385

(51) Int. Cl.
*H01L 33/00* (2010.01)
*H01L 33/38* (2010.01)

(52) U.S. Cl.
CPC .................. *H01L 33/382* (2013.01)

(58) Field of Classification Search
CPC ... H01L 33/38; H01L 33/382; H01L 33/387; H01L 33/385
See application file for complete search history.

(56) References Cited

U.S. PATENT DOCUMENTS

| 7,259,447 | B2* | 8/2007 | Kong ..................... H01L 33/38 257/676 |
| 7,541,206 | B2 | 6/2009 | Yoon et al. |
| 7,777,242 | B2 | 8/2010 | Yoneda |
| 7,968,361 | B2 | 6/2011 | Osawa et al. |
| 8,183,068 | B2 | 5/2012 | Lee et al. |
| 8,643,042 | B2* | 2/2014 | Choi ..................... H01L 33/382 257/100 |
| 2009/0101923 | A1* | 4/2009 | Choi ....................... H01L 33/20 257/89 |
| 2011/0084306 | A1* | 4/2011 | Jeong ..................... H01L 33/20 257/99 |

(Continued)

FOREIGN PATENT DOCUMENTS

| JP | 2009-158696 A | 7/2009 |
| JP | 2011-023639 A | 2/2011 |

(Continued)

*Primary Examiner* — Victor A Mandala
(74) *Attorney, Agent, or Firm* — Harness, Dickey & Pierce

(57) ABSTRACT

In one example embodiment, a semiconductor light emitting device includes a light emitting structure including a first conductivity-type semiconductor layer, an active layer, and a second conductivity-type semiconductor layer. The second conductivity-type semiconductor layer and the active layer having at least one contact hole exposing a region of the first conductivity-type semiconductor layer. The semiconductor light emitting device further includes at least one columnar structure disposed in the exposed region of the first conductivity-type semiconductor layer within the at least one contact hole. The semiconductor light emitting device further includes a first electrode disposed on the exposed region of the first conductivity-type semiconductor layer in which the at least one columnar structure is disposed, the first electrode being connected to the first conductivity-type semiconductor layer. The semiconductor light emitting device further includes a second electrode connected to the second conductivity-type semiconductor layer.

20 Claims, 17 Drawing Sheets

(56) References Cited

U.S. PATENT DOCUMENTS

| | | | |
|---|---|---|---|
| 2011/0210345 A1* | 9/2011 | Lim | H01L 33/20 257/88 |
| 2012/0001221 A1* | 1/2012 | Choi | H01L 27/15 257/99 |
| 2012/0049234 A1* | 3/2012 | Cheng | H01L 33/38 257/99 |
| 2012/0049236 A1* | 3/2012 | Kamiya | H01L 33/20 257/99 |
| 2012/0273823 A1* | 11/2012 | Yoneda | H01L 33/38 257/98 |
| 2013/0099265 A1* | 4/2013 | Hwang | H01L 25/0756 257/98 |
| 2013/0207156 A1* | 8/2013 | Moosburger | H01L 27/15 257/99 |
| 2014/0332820 A1* | 11/2014 | Han | H01L 33/62 257/76 |
| 2015/0236070 A1* | 8/2015 | Moosburger | H01L 27/15 257/99 |

FOREIGN PATENT DOCUMENTS

| | | |
|---|---|---|
| KR | 2005-0049066 A | 5/2005 |
| KR | 10-1134766 B1 | 4/2012 |

\* cited by examiner

SEMICONDUCTOR LIGHT EMITTING DEVICES

CROSS-REFERENCE TO RELATED APPLICATIONS

This application claims priority under 35 U.S.C. §119 to Korean Patent Application No. 10-2013-0011385 filed on Jan. 31, 2013, in the Korean Intellectual Property Office, the disclosure of which is incorporated herein by reference in its entirety.

BACKGROUND

1. Field of Invention

The present application relates to semiconductor light emitting devices and/or methods of manufacturing the same.

2. Description of the Related Art

Semiconductor light emitting devices emit light through the recombination of electrons and holes and are commonly used as light sources due to various advantages thereof such as low power consumption, high levels of luminance, compactness, and the like. In particular, after the development of nitride light emitting devices, the utilization thereof has been greatly expanded and nitride light emitting devices are employed as light sources in backlight units used for displays, general illumination devices, electric systems, and the like. Thus, in order to enhance light output (or optical power) and efficiency in a mounting scheme, light emitting devices having various electrode structures have been developed. In particular, research into improvements in the reliability of light emitting devices and the stability of electrode structures, as well as the enhancement of light output, is in progress.

SUMMARY

Some example embodiments provide semiconductor light emitting devices having enhanced reliability and/or methods of manufacturing the same.

Some example embodiments provide semiconductor light emitting devices having enhanced light output and/or methods of manufacturing the same.

However, the present subject disclosure is not limited thereto and may include objects and effects that may be recognized from technical solutions and/or example embodiments described hereinafter.

In one example embodiment, a semiconductor light emitting device includes a light emitting structure including a first conductivity-type semiconductor layer, an active layer, and a second conductivity-type semiconductor layer. The semiconductor light emitting device further includes at least one contact hole penetrating the second conductivity-type semiconductor layer and the active layer such that a region of the first conductivity-type semiconductor layer is exposed. The semiconductor light emitting device further includes at least one columnar structure disposed in the exposed region of the first conductivity-type semiconductor layer within the at least one contact hole. The semiconductor light emitting device further includes a first electrode disposed on the exposed region of the first conductivity-type semiconductor layer in which the at least one columnar structure is disposed, the first electrode being connected to the first conductivity-type semiconductor layer. The semiconductor light emitting device further includes a second electrode connected to the second conductivity-type semiconductor layer.

In yet another example embodiment, the at least one columnar structure is obtained from a semiconductor laminate identical to the light emitting structure.

In yet another example embodiment, the at least one columnar structure includes the first conductivity-type semiconductor layer, the active layer, and the second conductivity-type semiconductor layer sequentially laminated.

In yet another example embodiment, an area of a lateral surface of the at least one columnar structure is greater than an area of an upper surface of the at least one columnar structure.

In yet another example embodiment, the first electrode includes an ohmic-electrode layer directly in contact with the first conductivity-type semiconductor layer and a cover-electrode layer disposed on the ohmic-electrode layer.

In yet another example embodiment, the semiconductor light emitting device further includes a carrier substrate disposed on the light emitting structure, wherein the cover-electrode layer extends to the lateral surface of the at least one contact hole so as to be interposed between the carrier substrate and the light emitting structure.

In yet another example embodiment, the cover-electrode layer is directly in contact with the carrier substrate to bond the light emitting structure and the carrier substrate.

In yet another example embodiment, the carrier substrate is a conductive substrate and the carrier substrate is electrically connected to the cover-electrode layer.

In yet another example embodiment, the carrier substrate is electrically connected to the second electrode and be electrically insulated from the first electrode.

In yet another example embodiment, the semiconductor light emitting device further includes an electrode lead-out portion penetrating the carrier substrate, and connecting to at least one of the first electrode and the second electrode.

In yet another example embodiment, the columnar structure is disposed within a region in which the ohmic-electrode layer is disposed.

In yet another example embodiment, the cover-electrode layer includes a material selected from at least one of silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si) and germanium (Ge).

In yet another example embodiment, the cover-electrode layer includes a material selected from at least one of NiSn, CuSn, BiSn, AgSn and AuSn.

In yet another example embodiment, the first electrode covers at least a portion of the at least one columnar structure.

In one example embodiment, a semiconductor light emitting device includes a light emitting structure including a first conductivity-type semiconductor layer, an active layer, and a second conductivity-type semiconductor layer. The semiconductor light emitting device further includes a first electrode connected to the first conductivity-type semiconductor layer, penetrating the second conductivity-type semiconductor layer and the active layer and having a conductive via, the conductive via including a columnar structure disposed in the conductive via. The semiconductor light emitting device further includes a second electrode connected to the second conductivity-type semiconductor layer.

In one example embodiment, a semiconductor light emitting device includes a light emitting structure including a first layer includes at least one recessed portion, a second layer and a third layer. The light emitting device further includes at least one protruding structure protruding from the at least one recessed portion, the at least one protruding structure including a sequential stack of a portion of the first layer, the third layer and the second layer. The semiconductor light emitting device further includes a first electrode disposed on the at least one recessed portion of the first layer and a second electrode disposed on at least a portion of the second layer.

In yet another example embodiment, the at least one protruding structure has at least one of a conical shape, a cylindrical shape and a frustum shape.

In yet another example embodiment, the first electrode includes an ohmic-electrode layer disposed on the at least one protruding structure and directly contacting the first layer and a cover electrode layer disposed on the ohmic-electrode layer.

In yet another example embodiment, the portion of the second layer on which the second electrode is disposed, is adjacent to the at least one recessed portion and is in direct contact with the second layer.

In yet another example embodiment, the first layer and the second layer have different types of conductivity and the third layer is an active layer disposed between the first layer and the second layer.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EXAMPLE EMBODIMENTS

Figure 1:
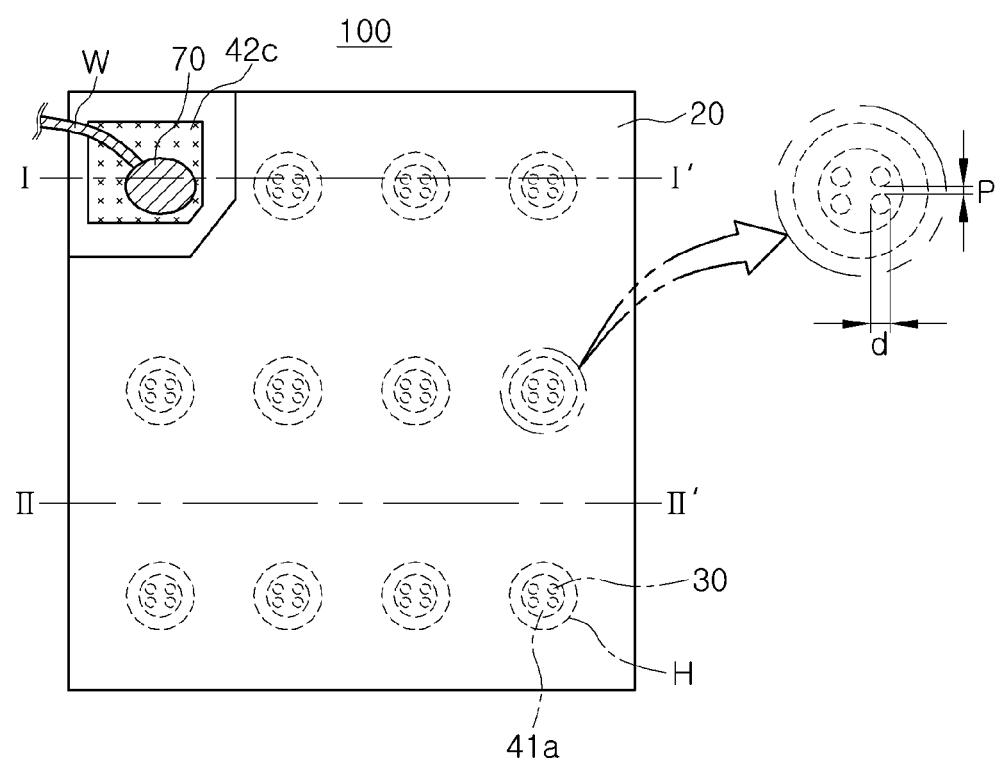
FIG. 1 is a top plan view of a semiconductor light emitting device, according to an example embodiment of the inventive concepts.

Various embodiments will now be described more fully with reference to the accompanying drawings. Like elements on the drawings are labeled by like reference numerals.

Detailed illustrative embodiments are disclosed herein. However, specific structural and functional details disclosed herein are merely representative for purposes of describing example embodiments. This invention may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs), computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium" or "computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware, or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Figure 2:
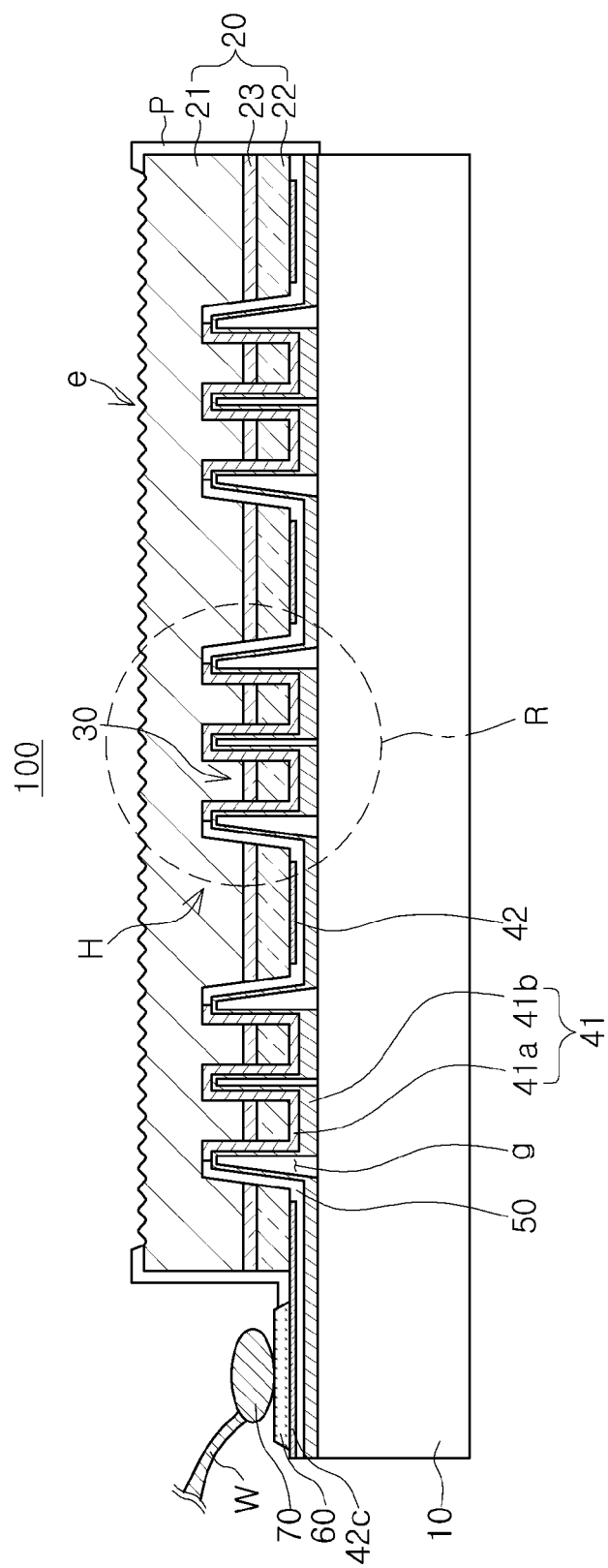
FIG. 2 is a cross-sectional view of the light emitting device of FIG. 1 taken along line I-I', according to an example embodiment.
Figure 3:
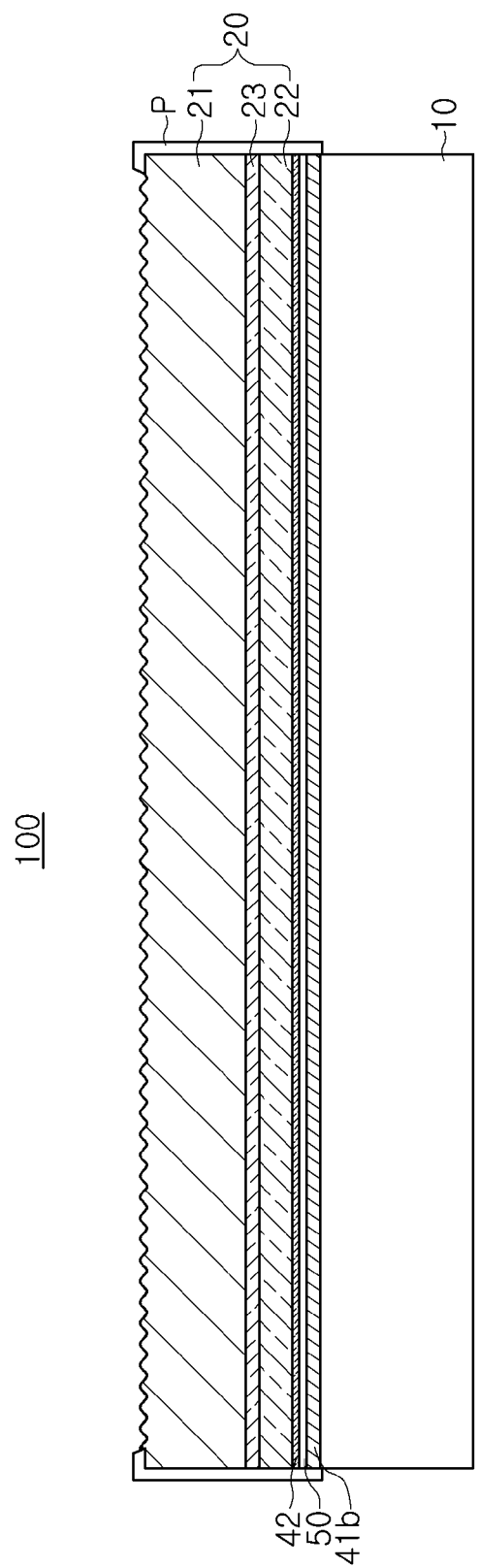
FIG. 3 is a cross-sectional view of the light emitting device of FIG. 1 taken along line II-II', according to an example embodiment.
Figure 4:
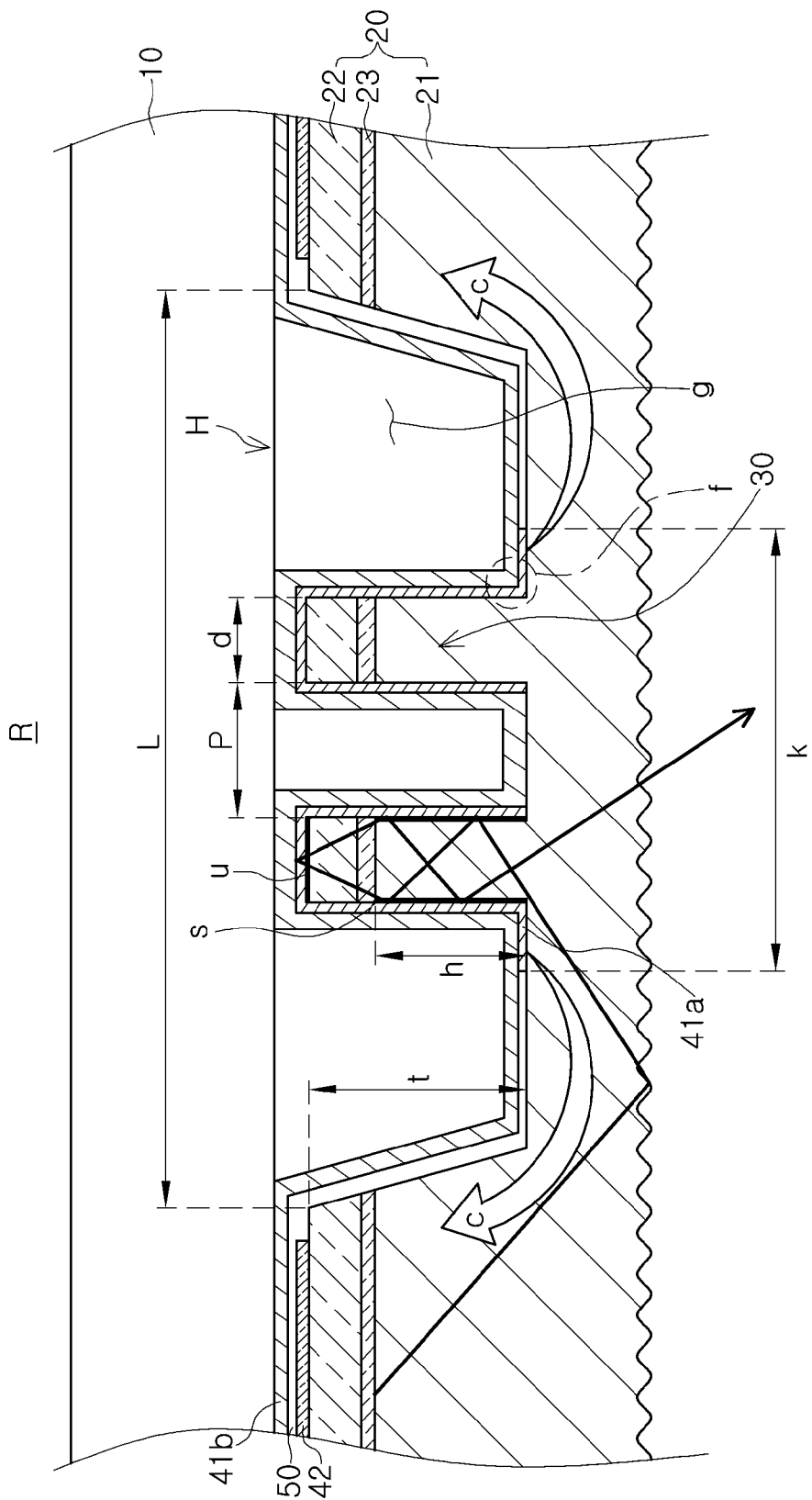
FIG. 4 is an enlarged cross-sectional view of region 'R' in FIG. 2, according to an example embodiment.

FIG. 1 is a top plan view of a semiconductor light emitting device, according to an example embodiment of the inventive concepts. FIG. 2 is a cross-sectional view of the light emitting device of FIG. 1 taken along line I-I', according to an example embodiment. FIG. 3 is a cross-sectional view of the light emitting device of FIG. 1 taken along line II-II', according to an example embodiment. FIG. 4 is an enlarged cross-sectional view of region 'R' in FIG. 2, according to an example embodiment.

Referring to FIGS. 1 and 2, a semiconductor light emitting device 100 according to an example embodiment, includes a carrier substrate 10, a light emitting structure including a first conductivity-type semiconductor layer 21, an active layer 23, and a second conductivity-type semiconductor layer 22 formed on the carrier substrate 10, and first and second electrodes 41 and 42 electrically connected to the first conductivity-type semiconductor layer 21 and the second conductivity-type semiconductor layer 22, respectively.

Here, the light emitting structure 20 includes at least one contact hole H penetrating the second conductivity-type semiconductor layer 22 and the active layer 23, such that a region of the first conductivity-type semiconductor layer 21 is exposed. At least one columnar structure 30 may be disposed in the exposed region of the first conductivity-type semiconductor layer 21 within the contact hole H. The first electrode 41 may be formed on the exposed region of the first conductivity-type semiconductor layer 21 in which the columnar structure 30 is formed, such that the first electrode 41 is connected to the first conductivity-type semiconductor layer 21.

In one example embodiment, the light emitting structure 20 may be a structure obtained by removing a growth substrate, after the carrier substrate 10 is disposed on a semiconductor laminate including the sequentially formed first conductivity-type semiconductor layer 21, active layer 23, and second conductivity-type semiconductor layer 22 in the growth substrate. In this case, the carrier substrate 10 may be a substrate having electrical conductivity.

In detail, the first and second conductivity-type semiconductor layers 21 and 22 constituting the light emitting structure 20 may be n-type and p-type semiconductor layers, respectively, and may be formed of a nitride semiconductor. Thus, in one example embodiment, it may be understood that the first and second conductivity types refer to an n type conductivity and a p type conductivity, respectively, but the inventive concepts are not limited thereto. The first and second conductivity-type semiconductor layers 21 and 22 may have an empirical formula $Al_xIn_yGa_{(1-x-y)}N$ (here, $0 \le x \le 1$, $0 \le y \le 1$, $0 \le x+y \le 1$), and, for example, may correspond to GaN, AlGaN, InGaN, and the like.

The active layer 23 formed between the first and second conductivity-type semiconductor layers 21 and 23 emits light having a certain level of energy according to electron-hole recombination, and may have a multi-quantum well (MQW) structure in which quantum well layers and quantum barrier layers are alternately laminated. Here, the MQW structure may be, for example, an InGaN/GaN structure. Meanwhile, the first and second conductivity-type semiconductor layers 21 and 22 and the active layer 23 may be formed by using a semiconductor layer growth process such as metal-organic chemical vapor deposition (MOCVD), molecular beam epitaxy (MBE), hydride vapor phase epitaxy (HVPE), or the like.

A region of the first conductivity-type semiconductor layer 21 may be exposed by at least one contact hole H penetrating the second conductivity-type semiconductor layer 22 and the active layer 23. The contact hole H may be formed by removing portions of the second conductivity-type semiconductor layer 22 and the active layer 23 after the laminate in which the first conductivity-type semiconductor layer 21, the active layer 23, and the second conductivity-type semiconductor layer 22 are sequentially disposed is formed. However, the inventive concepts are not limited thereto and the contact hole H may be formed when the semiconductor laminate is formed on a growth substrate. Also, as illustrated in FIG. 1, the contact hole H has a circular concave recess, but alternatively, the contact hole H may be implemented so as to expose a region of the first conductivity-type semiconductor layer 21.

In one example embodiment, as illustrated in FIG. 1, a plurality of contact holes H (e.g., eleven contact holes H) are formed to be positioned across the entire area of the light emitting structure 20. Since a plurality of contact holes H are formed across the entire area of the light emitting structure 20, uniform current spreading may be achieved and advantageously used in a large semiconductor light emitting device adapted for a high output.

At least one columnar structure 30 is formed in the region of the first conductivity-type semiconductor layer 21 exposed by the contact hole H. The columnar structure 30 may be obtained from a semiconductor laminate which is identical to the light emitting structure 20, but the inventive concepts are not limited thereto. In this case, the columnar structure may be formed by retaining portions of the second conductivity-type semiconductor layer 22 and the active layer 23, rather than removing them, within the interior of a region in which the contact hole H is to be formed, when portions of the second conductivity-type semiconductor layer 22 and the active layer 23 are removed to form the contact hole H. Accordingly, the columnar structure 30 may be understood as a protrusive structure in which the first conductivity-type semiconductor layer 21, the active layer 23, and the second conductivity-type semiconductor layer 22 are sequentially laminated.

Referring to FIG. 1, a plurality of columnar structures 30 (four structures) are formed in each contact hole H. As illustrated in FIG. 2, the columnar structure 30 has a cylindrical shape, but the amount and shape of the columnar structures 30 may alternatively be modified according to an application of the inventive concepts.

The first and second electrodes 41 and 42 serve to electrically connect the first and second conductivity-type semiconductor layers 21 and 22 to the outside. The first and second electrodes 41 and 42 may be connected to the first and second conductivity-type semiconductor layers 21 and 22, respectively.

In one example embodiment, the first electrode 41 may include an ohmic-electrode layer 41a and a cover-electrode layer 41b formed on the ohmic-electrode layer 41a. The first electrode (e.g., the ohmic-electrode layer 41a and the cover-electrode layer 41b) may be formed of a material selected from any one of, but not limited to, silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si), germanium (Ge), and combinations thereof. However, the inventive concepts are not limited thereto and any material having conductivity may be used to form the electrode according to an example embodiment of the inventive concepts.

The ohmic-electrode layer 41a may be disposed in the region of the first conductivity-type semiconductor layer 21 exposed by the contact hole H. In one example embodiment, since the ohmic-electrode layer 41a is formed within the contact hole H in which the columnar structure 30 is disposed, the ohmic-electrode layer 41a may include a region in contact with a surface of the contact hole H allowing the first conductivity-type semiconductor layer 21 to be exposed there through and regions covering the columnar structure 30 and being in contact with a lateral surface and an upper surface of the columnar structure 30.

The ohmic-electrode layer 41a may be formed as a single layer or multi-layer structure made of a conductive material having ohmic-characteristics with respect to the first conductivity-type semiconductor layer 21. Namely, although not shown in detail, the ohmic-electrode layer 41a may have a structure including two or more layers to enhance reflecting efficiency. In this case, the two or more layers may include any one of, but not limited to, Ni/Ag, Zn/Ag, Ni/Al, Zn/Al, Pd/Ag, Pd/Al, Ir/Ag. Ir/Au, Pt/Ag, Pt/Al, Ni/Ag/Pt, and the like.

The cover-electrode layer 41b may be formed on the ohmic-electrode layer 41a and may be formed of at least one silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si), germanium (Ge), and combinations thereof, for example. Also, in one example embodiment, the cover-electrode layer 41b may include a reflective material to allow light generated by the active layer 23 to be effectively reflected to a light emitting surface.

Meanwhile, in a case in which a relatively low-priced metal (e.g., NiSn, CuSn, BiSn) having a low level of wettability is employed as a material of the cover-electrode layer 41b, as illustrated in FIG. 2, the cover-electrode layer 41b, not completely filling the contact hole H, may extend to the lateral surface of the contact hole H so as to be interposed between the carrier substrate 10 and the light emitting structure 20. Accordingly, as described hereinafter with reference to FIG. 4, a cavity g may be formed due to the contact hole H when the light emitting structure 20 and the carrier substrate 10 are bonded.

In one example embodiment, the bond electrode layer 41b may serve as a bonding layer connecting the carrier substrate 10 and the light emitting structure 20, and in a case in which a conductive substrate is employed as the carrier substrate 10, the cover-electrode layer 41b may be electrically connected to the carrier substrate 10, whereby the carrier substrate 10 may be implemented to serve as an electrode applying driving power to the first conductivity-type semiconductor layer 21.

The second electrode 42 may be formed on the second conductivity-type semiconductor layer 22 so as to be in electrical contact therewith. In particular, the second electrode 42 may form ohmic-contact with the second conductivity-type semiconductor layer 22. As illustrated in FIG. 2, the second electrode 42 interposed between the light emitting structure 20 and the carrier substrate 10 may include an exposed surface 42c, the exposed surface 42c is extended outwardly. Since the light emitting structure 20 is not formed on the exposed surface 42c of the second electrode 42, the exposed surface 42c may be easily connected to an electrode pad 60. A wire W may be connected to the electrode pad 60 through a wire bonding unit 70.

The first conductivity-type semiconductor layer 21 and the second conductivity-type semiconductor layer 22 may be electrically separated to allow a current introduced when driving power is applied, to pass through the active layer 23. In one example embodiment, the first electrode 41 is required to be insulated from the active layer 23, the second conductivity-type semiconductor layer 22, and the second electrode 42. To this end, the semiconductor light emitting device 100 according to an example embodiment of the inventive concepts may further include an insulating part 50 interposed between the first electrode 41 and the second electrode 42 for electrical separation there between.

In detail, referring to FIG. 2, the insulating unit 50 may be provided on the lateral surface of the contact hole H such that it is insulated from the active layer 32 and the second conductivity-type semiconductor layer 22. Also, the insulating unit 50 may also be interposed between the second electrode 42 formed on the second conductivity-type semiconductor layer 22 and the first electrode 41 to insulate the first electrode 41 and the second electrode 42.

The insulating part 50 may be formed of a material having electrical insulating properties, and in this case, preferably, a material having a low degree of light absorption may be used. For example, a silicon oxide ($SiO_2$), a silicon nitride ($Si_xN_y$), or a silicon oxynitride ($SiO_xN_y$) may be used.

An unevenness pattern e may be formed on the light emitting structure 20. In one example embodiment, the unevenness pattern e may be formed on an upper surface of the first conductivity-type semiconductor layer 21. Since a rate at which light generated by the active layer 23 is emitted to the outside is increased by the unevenness pattern e, light extraction efficiency can be enhanced.

The semiconductor light emitting device 100 may further include a passivation layer P covering the sides of the light emitting structure 20. The passivation layer P may serve to protect the light emitting structure 20, in particular, the active layer 23, from an external environment. In detail, the active layer 23 exposed to the outside may serve as a current leakage path during an operation of the semiconductor light emitting device, and the formation of the passivation layer P may prevent the problem. Here, the passivation layer P may be formed of at least one of a silicon oxide ($SiO_2$), a silicon nitride ($Si_xN_y$), and a silicon oxynitride ($SiO_xN_y$).

Hereinafter, the semiconductor light emitting device 100 according to an example embodiment will be described with reference to the cross-sectional view of the semiconductor light emitting device 100 illustrated in FIG. 1, taken along line II-II'.

FIG. 3 is a cross-sectional view of the light emitting device 100 according to the embodiment of FIG. 1, taken along line II-II'.

Referring to FIG. 3, in the semiconductor light emitting device 100, the first electrode 41, specifically, the cover-electrode layer 41b, may be formed on the carrier substrate 10 having electrical conductivity, and the cover-electrode layer 41b and the second electrode 42 are electrically separated by an insulating part 50. The light emitting structure 20 in which the second conductivity-type semiconductor layer 22, the active layer 23, and the first conductivity-type semiconductor layer 21 are laminated may be formed on the second electrode 42.

As described above with reference to FIGS. 1 through 3, the carrier substrate 10 is connected to the first conductivity-type semiconductor layer 21 by the first electrode 41 having the cover-electrode layer 41b and the ohmic-electrode layer 41a, and it may not be necessary to form an electrode in an upper surface of the first conductivity-type semiconductor layer 21. Thus, a quantity of light emitted from the upper surface of the first conductivity-type semiconductor layer 21 may be increased. In such case, since the contact hole H is formed in a portion of the active layer 23, a light emitting region may be reduced, but an effect of enhancing light extraction efficiency that may be obtained by omitting an electrode from an upper surface of the first conductivity-type semiconductor layer 21 provided as light emitting surface may offset such a reduction.

Meanwhile, when the carrier substrate 10 is bonded to the light emitting structure 20, voids g may be formed between the light emitting structure 20 and the carrier substrate 10 due to the presence of the contact hole H. This will be described in detail with reference to FIG. 4.

FIG. 4 is an enlarged cross-sectional view illustrating region 'R' in FIG. 2. In order to convey a better understanding of the inventive concepts, FIG. 4 illustrates a reversed form of region R in FIG. 2.

Referring to FIG. 4, the contact hole H penetrates the second conductivity-type semiconductor layer 22 and the active layer 23 and allows a region of the first conductivity-type semiconductor layer 21 to be exposed there through, and the columnar structure 30 is formed in the exposed region of the first conductivity-type semiconductor layer 21.

In one example embodiment, the contact hole may have an opening having a diameter L and may have a concave recess shape having a thickness t, but the inventive concepts are not limited thereto. Here, the diameter L of the contact hole H may range from 20 um to 80 um, and the thickness t may range from approximately 0.5 um to 5 um. However, these dimensions are merely numerical examples provided to help in an understanding of the inventive concepts and, obviously, they may be modified within various diameter and thickness ranges.

According to circumstances, in particular, when metal having a low level of wettability is used as a material of the cover-electrode layer 41b, the cover-electrode layer 41b may be formed on the lateral surface of the contact hole H, rather than completely filling the contact hole H, and thus, voids g may be formed due to the contact hole H between the carrier substrate 10 and the light emitting structure 2.

The voids g formed within the light emitting structure 20 prevent the light emitting structure 20 from being sufficiently supported by the carrier substrate 10, causing cracks in the light emitting structure 20 to degrade reliability and stability.

However, the semiconductor light emitting device 100 according to an example embodiment, since the columnar structures 30 are formed within the contact hole H, an area occupied by the voids g may be reduced and the light emitting structure 20 may be effectively supported by the carrier substrate 10.

Namely, by complementing the height of the columnar structure 30 (e.g., by forming the columnar structure 30 to have a sufficient height), the carrier substrate 10 and the light emitting structure 20 may be bonded (or attached) by the medium of the first electrode (e.g., the ohmic-electrode layer 41a and the cover-electrode layer 41b in the example embodiment) even within the contact hole H. Since the cover-electrode layer 41b is tightly attached to the sides of the columnar structure 30 in region f in which the cover-electrode layer 41b is contiguous with the first conductivity-type semiconductor layer 21 due to surface tension, the light emitting structure 20 may be effectively supported by the carrier substrate 10.

The columnar structure 30 may be formed by not removing portions of the light emitting structure 20 in forming the contact hole H. Accordingly, the columnar structure 30, protruding from the first conductivity-type semiconductor layer 21, may include the first conductivity-type semiconductor layer 21, the active layer 23, and the second conductivity-type semiconductor layer 22 which are sequentially laminated. Therefore, a height of the columnar structure 30 may be substantially equal to the thickness t of the contact hole H.

Also, the columnar structure 30 may lower a driving voltage of the light emitting device according to the design thereof.

In detail, the ohmic-electrode layer 41a may be formed to cover an upper surface u and lateral surface s of the columnar structure 30, and in this case, an ohmic-contact area between the ohmic-electrode layer 41a and the first conductivity-type semiconductor layer 21 may be increased due to the presence of the columnar structure 30.

In one example embodiment, when it is assumed that the columnar structure 30 has a cylindrical shape, the increased ohmic-contact area between the ohmic-electrode layer 41a and the first conductivity-type semiconductor layer 21 is π·d·h and an ohmic-contact area reduced due to the presence of the columnar structure 30 is calculated to be $$\frac{\pi \cdot d^2}{4}$$

(here, d is a diameter of the columnar structure 30, h is a height of a region of the lateral surface s of the columnar structure 30 in which the first conductivity-type semiconductor layer 21 is formed). Thus, in one example embodiment, for example, by adjusting the diameter d of the columnar structure 30 to satisfy d≤4h, the ohmic-contact area between the ohmic-electrode layer 41a and the first conductivity-type semiconductor layer 21 may be increased. In this case, since contact resistance is reduced, a driving voltage of the light emitting device may be effectively lowered and charge carrier injection efficiency may be improved. Namely, to this end, the columnar structure 30 may be formed such that the area of the upper surface thereof is greater than that of the lateral surfaces thereof.

In one example embodiment, since the diameter d of the columnar structure 30 is not limited to the foregoing conditions, the columnar structure 30 may have a sufficiently large diameter. In this case, an ohmic-contact area between the ohmic-electrode layer 41a and the first conductivity-type semiconductor layer 21 may be reduced, but nevertheless, a driving current of the light emitting device may rarely be increased.

This is because electrons (or holes) c injected from the first electrode 41 tend to move to the second electrode 42 by way of a path having the least resistance, so the electrons (or holes) c injected into the first electrode 41 mostly form a path in the end of the ohmic-electrode layer 41a as illustrated. Namely, it may be seen that a reduction in the internal area of the surfaces defined by regions of the ohmic-electrode layer 41a rarely affects an increase in driving power of the light emitting device.

In consideration of such features, when the ohmic-electrode layer 41a has a diameter k smaller than the diameter L of the contact hole H, the columnar structure 30 may be interposed within the surfaces defined by the regions of the ohmic-electrode layer 41a as illustrated.

Also, in one example embodiment, the columnar structure 30 may further improve light extraction efficiency.

In detail, a partial amount of light generated by the active layer 23 may be reflected from the interface between the first conductivity-type semiconductor layer 21 and an external material (e.g., air) so as to propagate internally. In this case, the columnar structure 30 may serve to change a light path to allow light propagating within the device to be easily output to the outside. In this case, the cover-electrode layer 41b may include a reflective material.

Figure 5A:
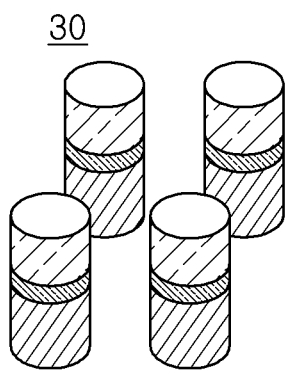
FIGS. 5A through 5C are perspective views illustrating shapes of a columnar structure (or a pillar structure) that may be employed, according to example embodiments of the inventive concepts.
Figure 5B:
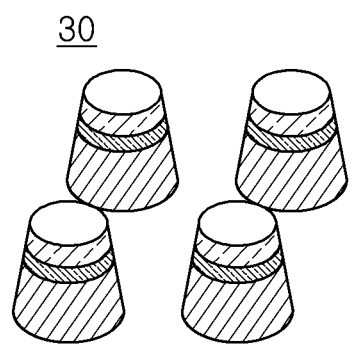
Figure 5C:
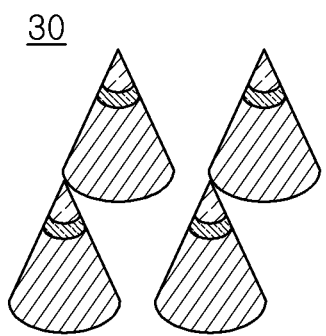

FIGS. 5A through 5C are perspective views illustrating shapes of the columnar structure 30 that may be employed in an example embodiment of the inventive concepts.

As illustrated in FIGS. 5A through 5C, the columnar structure 30 that may be employed in one example embodiment, may have at least one of a cylindrical shape, a truncated conical shape, and a conical shape. These examples are merely illustrative and any protruded shape having an area and a height may be employed in the inventive concepts without any limitation.

Figure 6:
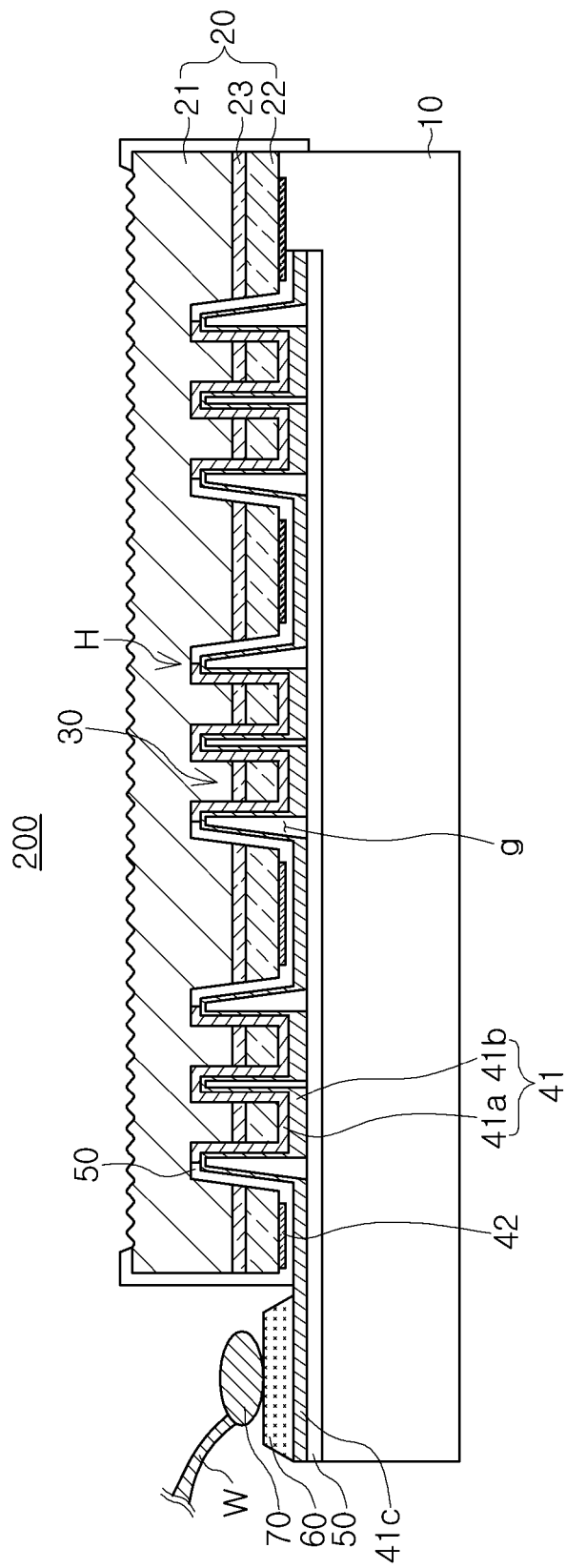
FIG. 6 is a cross-sectional view of a semiconductor light emitting device according to a modification of FIG. 1, according to an example embodiment.
Figure 7:
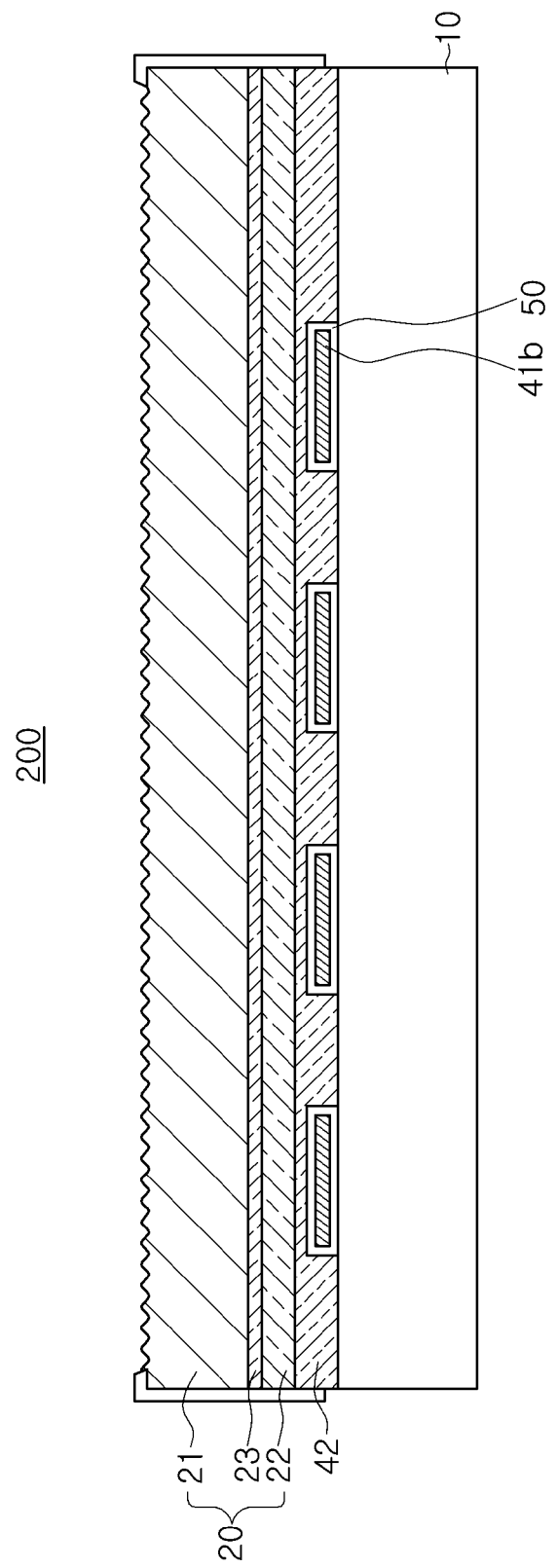
FIG. 7 is a cross-sectional view of the semiconductor light emitting device of FIG. 6 taken along line II-II' on the basis of FIG. 1, according to an example embodiment.

FIGS. 6 and 7 illustrate a semiconductor light emitting device 200, according to example embodiments of the inventive concepts. Hereinafter, components described with respect to example embodiments above, will be briefly described while different components will be emphasized.

FIG. 6 is a cross-sectional view of the semiconductor light emitting device 200 according to one example embodiment, taken along line I-I' in FIG. 1, and FIG. 7 is a cross-sectional view of the semiconductor light emitting device 200 taken along line II-II' in FIG. 1.

Referring to FIG. 6, the semiconductor light emitting device 200 according to one example embodiment includes the carrier substrate 10, the light emitting structure including the first conductivity-type semiconductor layer 21, the active layer 23, and the second conductivity-type semiconductor layer 22 formed on the carrier substrate 10, and the first and second electrodes 41 and 42. The first and second electrodes 41 and 42 may be electrically connected to the first conductivity-type semiconductor layer 21 and the second conductivity-type semiconductor layer 22, respectively.

The light emitting structure 20 includes at least one contact hole H penetrating the second conductivity-type semiconductor layer 22 and the active layer 23 such that a region of the first conductivity-type semiconductor layer 21 is exposed. At least one columnar structure 30 may be formed in the exposed region of the first conductivity-type semiconductor layer 21 within the contact hole H. The first electrode 41 may be formed on the exposed region of the first conductivity-type semiconductor layer 21 in which the columnar structure 30 is formed, such that the first electrode 41 is connected to the first conductivity-type semiconductor layer 21.

Here, the first electrode 41 may include the ohmic-electrode layer 41a directly in contact with the first conductivity-type semiconductor layer 21 and the cover-electrode layer 41b formed on the ohmic-electrode layer 41a. The cover-electrode layer 41b, not completely filling the contact hole H, may extend to the lateral surface of the contact hole H so as to be interposed between the carrier substrate 10 and the light emitting structure 20. In this example embodiment, the cover-electrode layer 41b may further include an exposed surface 41c extending outwardly. Since the light emitting structure 20 is not formed on the exposed surface 41c of the cover-electrode layer, the exposed surface 41c of the cover-electrode layer 41b may be easily connected to the electrode pad 60. In this case, a wire W may be connected to the electrode pad 60 through the wire bonding unit 70.

In one example embodiment, the semiconductor light emitting device 200 may include the insulating part 50 covering the lateral surface of the contact hole H in order to electrically separate the cover-electrode layer 41b from the active layer 23 and the second conductivity-type semiconductor layer 22 of the light emitting structure 20. The insulating part 50 may be also formed between the cover-electrode layer 41b and the second electrode 42 and between the cover-electrode layer 41b and the carrier substrate 10 in order to electrically separate the cover-electrode layer 41b from the second electrode 42 and the carrier substrate 10 formed on the second conductivity-type semiconductor layer 22.

According to one example embodiment, the carrier substrate 10 may have conductivity and may be electrically connected to the second electrode 42 to serve as an electrode applying driving power to the second conductivity-type semiconductor layer 22.

One example embodiment will be described in more detail with reference to FIG. 7.

FIG. 7 is a cross-sectional view of the semiconductor light emitting device 200 according to the one example embodiment, taken along line II-II' in FIG. 1.

Referring to FIG. 7, the semiconductor light emitting device 200 includes the carrier substrate 10 having electrical conductivity, the second electrode 42, and the light emitting structure 20 in which the second conductivity-type semiconductor layer 22, the active layer 23, and the first conductivity-type semiconductor layer 21 sequentially disposed on the second electrode 42. The first electrode 41, in particular, the cover-electrode layer 41b illustrated in FIG. 7, may be an element that connects the contact holes H and may be covered by the insulating part 50 so as to be electrically separated from the second electrode 42 and the carrier substrate 10.

According to one example embodiment, the carrier substrate 10 is electrically connected to the second conductivity-type semiconductor layer 22 by the second electrode 42, and since the electrode pad 60 is formed on the cover-electrode layer 41b having the exposed surface 41c, it is unnecessary to form an additional electrode on an upper surface of the first conductivity-type semiconductor layer 21 provided as a light emitting surface. Thus, an amount of light emitted from the upper surface of the first conductivity-type semiconductor layer may be increased.

Also, by forming the columnar structure 30, voids g between the light emitting structure 20 and the carrier substrate 10 due to the formation of the contact holes H may be effectively reduced, and the light emitting structure 20 may be effectively supported by the first electrode 41 even in the region in which the contact hole H his formed.

Figure 8:
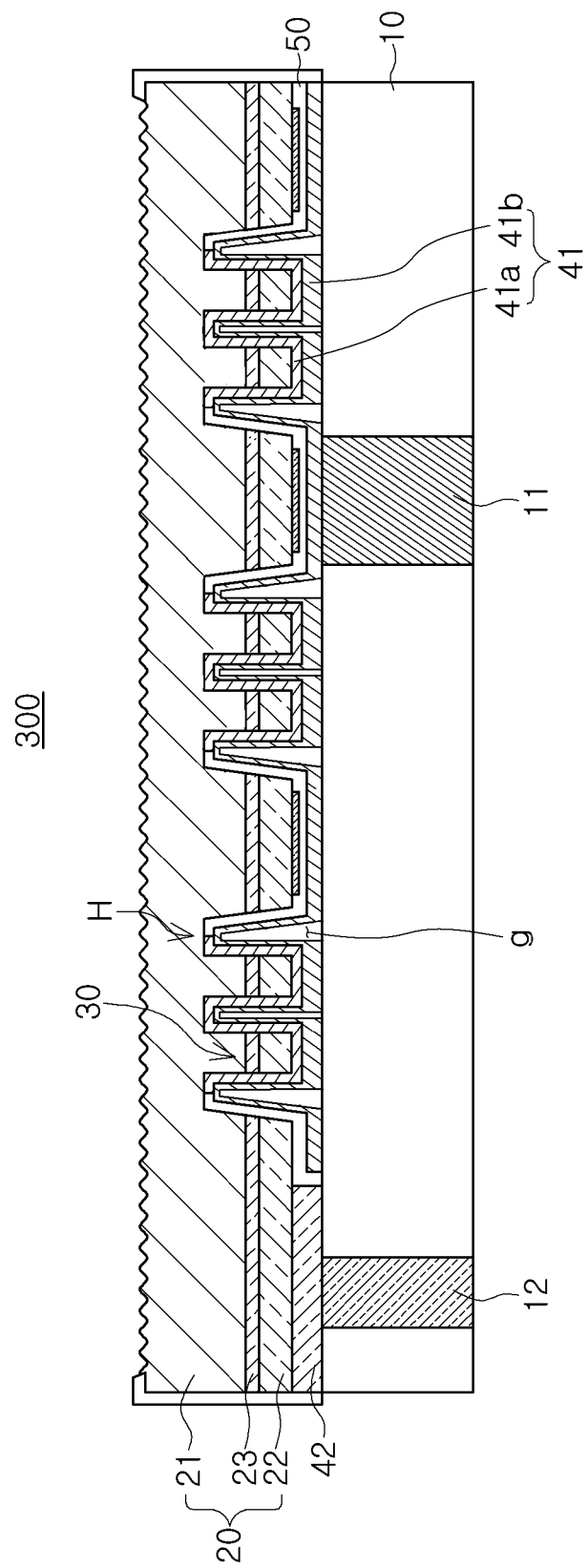
FIGS. 8 through 10 are cross-sectional views of light emitting devices, according to example embodiments of the inventive concepts.

FIG. 8 illustrates a semiconductor light emitting device 300, according to an example embodiment of the inventive concepts.

Specifically, FIG. 8 is a cross-sectional view of the semiconductor light emitting device 300 according to an example embodiment, taken along line I-I' in FIG. 1.

Referring to FIG. 8, the carrier substrate 10 may be directly in contact with the first and second electrodes 41 and 42, and the first and second electrodes 41 and 42 may be electrically connected to first and second electrode lead-out portions 11 and 12 formed in the carrier substrate 10 so as to be led out. In this case, the carrier substrate 10 may be formed of an insulating substrate and the first and second electrode lead-out portions 11 and 12 may be conductive.

According to one example embodiment, an electrode connection between the light emitting structure 20 and an external circuit is implemented by using the carrier substrate 10 having the first and second electrode lead-out portions 11 and 12, advantageously eliminating the necessity of forming an electrode pad.

Figure 9:
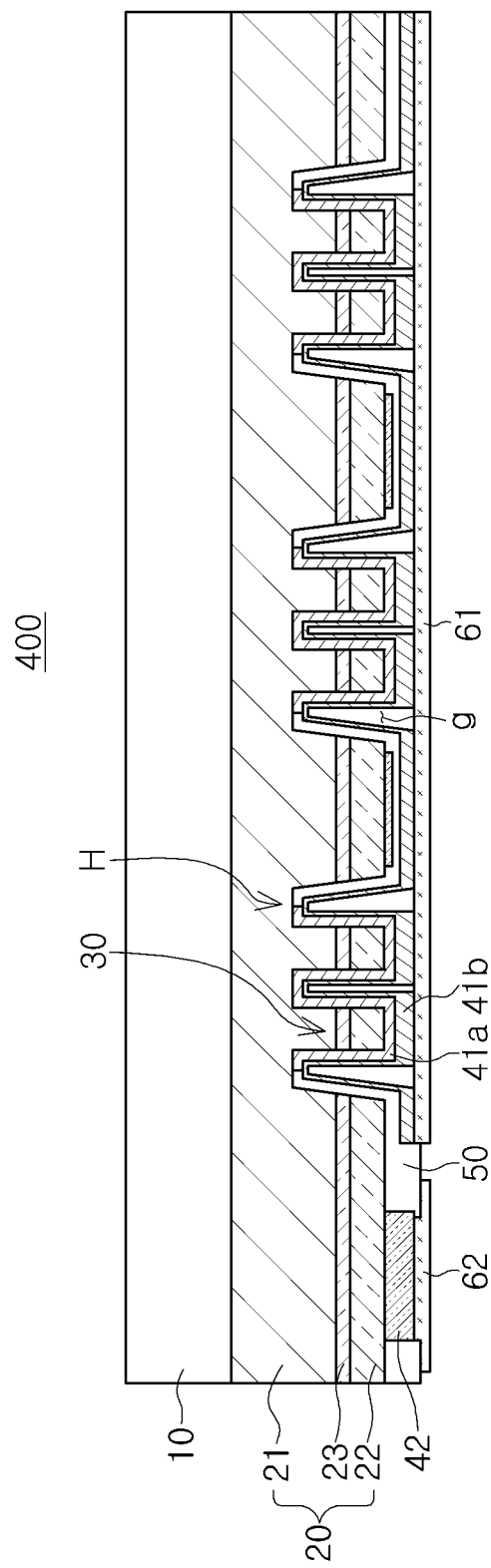

FIG. 9 illustrates a semiconductor light emitting device 400, according to an example embodiment of the inventive concepts.

Referring to FIG. 9, the semiconductor light emitting device 400 according to one example embodiment includes the carrier substrate 10, the light emitting structure 20 including the first conductivity-type semiconductor layer 21, the active layer 23, and the second conductivity-type semiconductor layer 22 formed sequentially on the carrier substrate 10, and the first and second electrodes 41 and 42. The first and second electrodes 41 and may be electrically connected to the first and second conductivity-type semiconductor layers 21 and 22, respectively.

In one example embodiment, the carrier substrate 10 may be a growth substrate provided to grow the light emitting structure 20. In detail, the carrier substrate 10 may be made of a material including, but not limited to, sapphire, SiC, $MgAl_2O_4$, MgO, $LiAlO_2$, $LiGaO_2$, GaN, or the like. Here, sapphire is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures.

The concavo-convex pattern may be formed in at least one of a surface, both sides, and lateral surfaces of the substrate 10 to enhance light extraction efficiency. The concavo-convex pattern may be selected within a range from 5 nm to 500 nm. However, the inventive concepts is not limited thereto and the concavo-convex pattern may be formed to be greater or smaller than the range in consideration of the size of the light emitting device as long as it may enhance light extraction efficiency. Also, the concavo-convex pattern may have various shapes such as a columnar shape, a mountain shape, a hemispherical shape, and the like.

In one example embodiment, the buffer layer 24 may be formed between the substrate 10 and the light emitting structure 20. When a material of the substrate and a material of the light emitting structure grown on the substrate are different, a dislocation density of the light emitting structure may be increased due to disparity in the lattice constants thereof and the substrate is bowed due to a difference in coefficients of thermal expansion, causing cracks. The buffer layer 24 formed between the substrate 10 and the light emitting structure 20 may serve to reduce the generation of the dislocation and cracks in the light emitting structure 20. Also, the buffer layer 24 may regulate a degree of bowing of the substrate 10 when the active layer 23 is grown, serving to reduce a wavelength distribution of a wafer.

The buffer layer 24 may be formed of $Al_xIn_yGa_{1-x-y}N$ ($0 \leq x \leq 1$, $0 \leq y \leq 1$), in particular, GaN, AlN, AlGaN. Also, materials such as $ZrB_2$, $HfB_2$, ZrN, HfN, TiN, and the like, may also be used as a material of the buffer layer 24. The buffer layer 24 may have a structure including a combination of a plurality of layers or a structure in which compositions of layers are gradually changed.

The light emitting structure 20 may include at least one contact hole H penetrating the second conductivity-type semiconductor layer 22 and the active layer 23 such that a region of the first conductivity-type semiconductor layer 21 is exposed. At least one columnar structure 30 may be formed in the exposed region of the first conductivity-type semiconductor layer 21 within the contact hole H.

The first electrode 41 may include the ohmic-electrode layer 41a and the cover-electrode layer 41b. The ohmic-electrode layer 41a is directly connected to the first conductivity-type semiconductor layer 21 and the cover-electrode layer 41b may be formed on the ohmic-electrode layer 41a. Also, the cover-electrode layer 41b may extend along the lateral surface of the contact holes H so as to be also disposed on the upper surface of the second conductivity-type semiconductor layer 22. Here, the insulating part 50 may be interposed to electrically separate the second conductivity-type semiconductor layer 22 and the second electrode 42 from the cover-electrode layer 41b.

First and second pad electrodes 61 and 62 may be formed on the first and second electrodes 41 and 42, respectively, and driving power may be applied from the pad electrodes 61 and 62 to the light emitting structure 20. Namely, the first and second pad electrodes 61 and 62 may serve as external terminals of the light emitting device and may include a reflective material to effectively induce light generated by the active layer 23 to the substrate.

In the case of the semiconductor light emitting device 400 according to one example embodiment, a generation of a step portion between the first and second electrodes 41 and 42 in mounting the light emitting device may be easily solved, and since the junction area of the mounting surface is increased by the first and second pad electrodes 61 and 62, excellent heat dissipation effect may be obtained.

Also, since the columnar structure 30 is formed within the contact hole H, voids g between the light emitting structure 20 and the carrier substrate 10 due to the formation of the contact hole H may be effectively reduced. Also, since the light emitting structure 20 is effectively supported by the first electrode 41 even in the region of the contact hole H, reliability and stability of the light emitting device may be enhanced.

Figure 10:
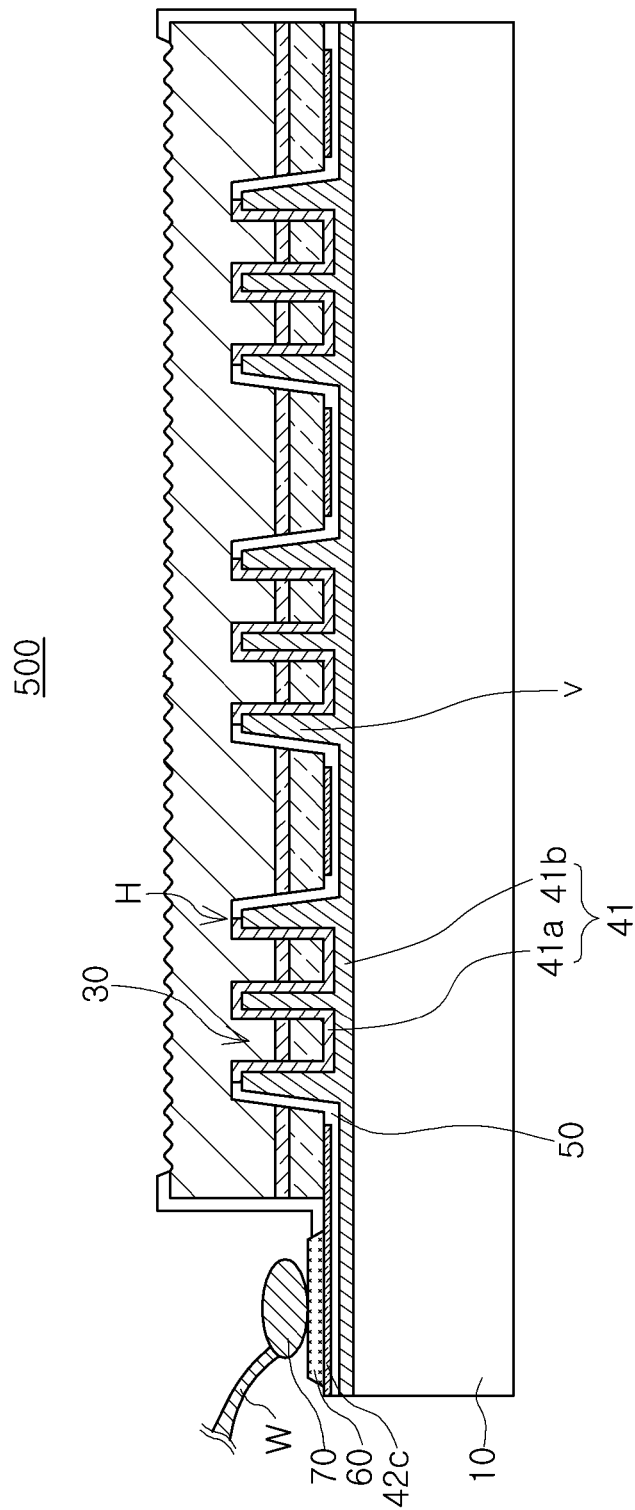

FIG. 10 illustrates a semiconductor light emitting device 500 according to another modification of the inventive concepts.

Referring to FIG. 10, similar to the semiconductor light emitting device described above with reference to FIGS. 1 through 3, the semiconductor light emitting device 500 according to one example embodiment includes the carrier substrate 10, the light emitting structure 20 including the first conductivity-type semiconductor layer 21, the active layer 23, and the second conductivity-type semiconductor layer 22 formed sequentially on the carrier substrate 10, and the first and second electrodes 41 and 42 electrically connected to the first and second conductivity-type semiconductor layers 21 and 22, respectively.

The light emitting structure 20 includes at least one contact hole H penetrating the second conductivity-type semiconductor layer 22 and the active layer 23 such that a region of the first conductivity-type semiconductor layer 21 is exposed. At least one columnar structure 30 may be formed in the exposed region of the first conductivity-type semiconductor layer 21 within the contact hole H. The first electrode 41 may be formed on the exposed region of the first conductivity-type semiconductor layer 21 in which the columnar structure 30 is formed, such that the first electrode 41 is connected to the first conductivity-type semiconductor layer 21. Here, the first electrode 41 may include the ohmic-electrode layer 41a directly in contact with the first conductivity-type semiconductor layer 21 and the cover-electrode layer 41b formed on the ohmic-electrode layer 41a.

Also, in order to prevent the cover-electrode layer 41b from being electrically connected to an undesired portion, the insulating part 50 may be formed on the lateral surface of the contact hole H. The insulating part 50 may also be interposed between the cover-electrode layer 41b and the second electrode 42 and the second conductivity-type semiconductor layer 22.

Meanwhile, in one example embodiment, the cover-electrode layer 41b is formed to fill an empty space of the contact hole H. In this case, the cover-electrode layer 41b may be understood to include a conductive via v connected to the first conductivity-type semiconductor layer 21 through the second conductivity-type semiconductor layer 23. The cover-electrode layer 41b may be easily implemented with a metal material having a relatively high level of wettability. For example, the metal material may include Au, AuSn, AgSn or the like.

Also, the columnar structure 30 may be formed within the contact hole H. The first electrode (in this case, the ohmic-electrode layer 41a and the cover-electrode layer 41b) may be formed to cover the columnar structure 30, and in this case, the columnar structure 30 may be included within the cover-electrode layer 41b forming the conductive via v.

According to an example embodiment, the formation of the conductive via increases a current spreading effect, and since the columnar structure 30 is formed within the conductive via v, supporting efficiency between the light emitting structure 20 and the carrier substrate 10 may be enhanced. Also, since a junction area between the conductive via v and the first conductivity-type semiconductor layer 21 is increased, a driving voltage may be reduced and light extraction efficiency may be improved from a concavo-convex effect due to the columnar structure 30.

Hereinafter, a method for manufacturing the semiconductor light emitting device 100 according to the embodiment of FIGS. 1 through 3 will be described briefly.

FIGS. 11 through 16 are cross-sectional views illustrating a process of a method for manufacturing the semiconductor light emitting device of FIG. 1.

Here, however, the manufacturing method may provide a better understanding of the inventive concepts, so the light emitting device according to the embodiments is not limited thereto and, obviously, may be manufactured through various methods other than the foregoing method.

Figure 11:
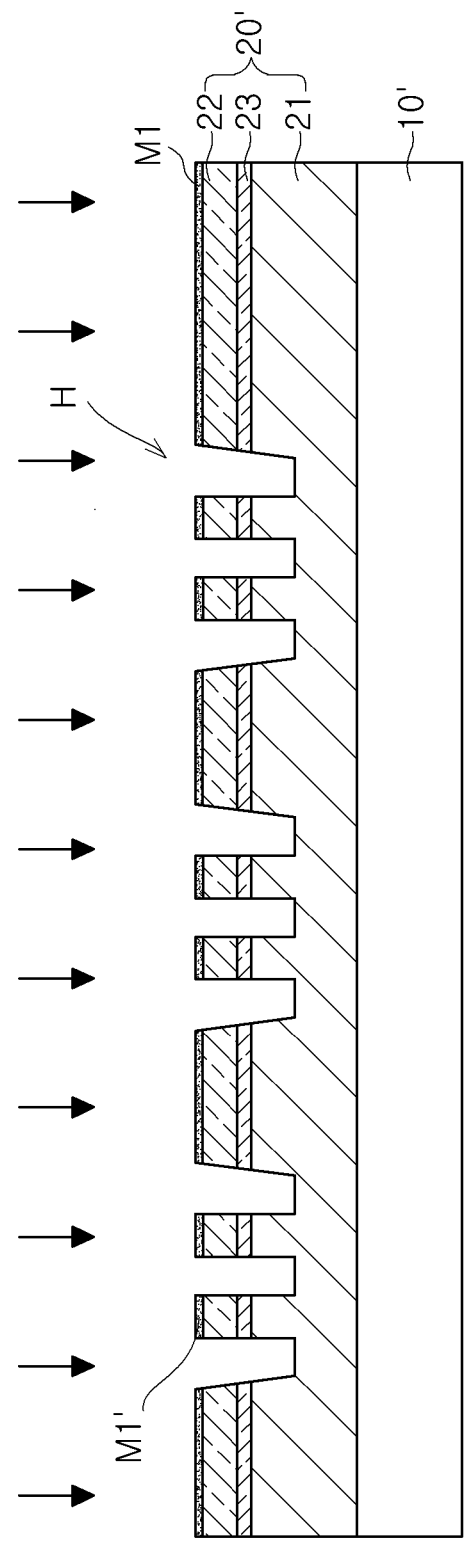
FIGS. 11 through 16 are cross-sectional views illustrating a process of a method for manufacturing the semiconductor light emitting device of FIG. 1, according to example embodiments.

First, referring to FIG. 11, the semiconductor laminate 20' in which the first conductivity-type semiconductor layer 21, the active layer 23, and the second conductivity-type semiconductor layer 22 are sequentially disposed on a growth substrate 10' may be prepared. The semiconductor laminate 20' may be provided as the light emitting structure 20 of the semiconductor light emitting device according to one example embodiment according to a follow-up process.

Thereafter, the contact hole H penetrating the second conductivity-type semiconductor layer 22 and the active layer 21 such that a region of the first conductivity-type semiconductor layer 21 is exposed may be formed on the semiconductor laminate 20'. In this case, as illustrated, wet etching, dry etching, or the like, using a mask pattern M1 may be performed. Here, by forming a mask pattern M1' even in the region in which the columnar structure 30 is to be formed within the contact hole H, the contact hole H, together with the columnar structure 30, may be formed.

For example, if photoresist is employed as a mask, the mask patterns M1 and M1' may be formed by using a phenomenon in which a photosensitive portion is not dissolved (negative type) or dissolved (positive type) through laser interference lithography (LIL) or photolithography.

Figure 12:
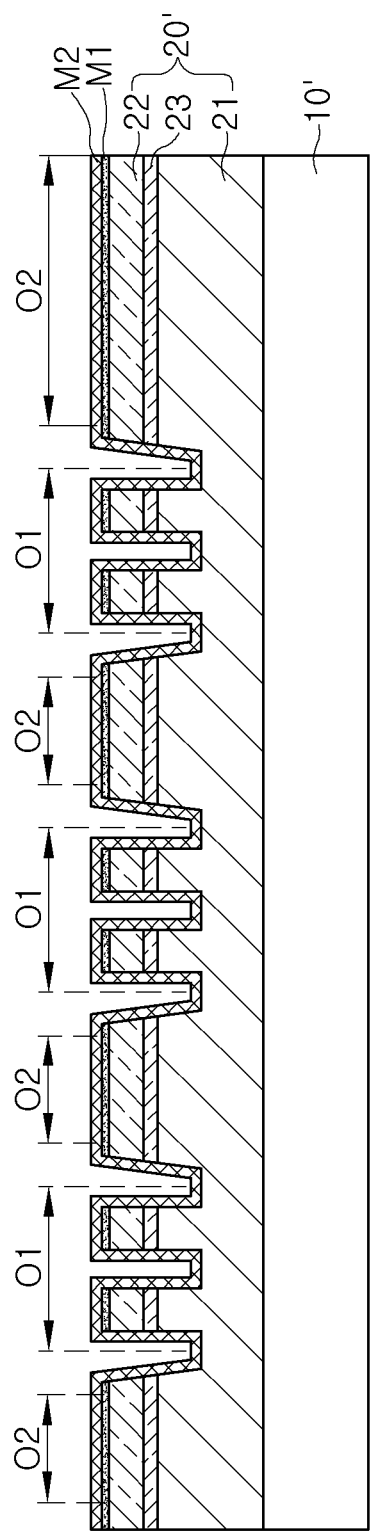

Next, as illustrated in FIG. 12, a second mask M2 is formed on the semiconductor laminate 20', and open regions are sequentially formed in positions O1 in which the ohmic-electrode layer 41a of the first electrode 41 is to be formed and positions O2 in which the second electrode 42 is to be formed, such that the semiconductor laminate 20' is exposed.

Figure 13:
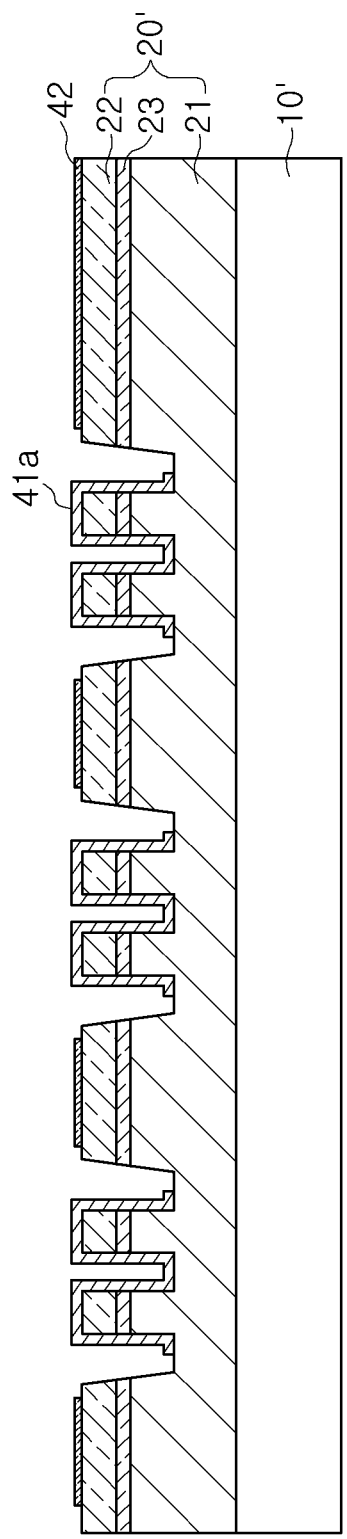

Thereafter, an electrode material is formed on the semiconductor laminate 20' and the mask is removed. Then, as illustrated in FIG. 13, the ohmic-electrode layer 41a of the first electrode 41 and the second electrode 42 are formed in the regions defined by the open regions. In this case, a process such as sputtering, deposition, or the like, known in the art may be appropriately used. The second electrode 42 and the ohmic-electrode layer 41a may include silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si), germanium (Ge), or the like. Alternatively, the second electrode 42 and the ohmic-electrode layer 41a may have a structure including two or more layers to enhance reflecting efficiency. In this case, the two or more layers may include, for example, Ni/Ag, Zn/Ag, Ni/Al, Zn/Al, Pd/Ag, Pd/Al, Ir/Ag. Ir/Au, Pt/Ag, Pt/Al, Ni/Ag/Pt, and the like.

In this manner, the ohmic-electrode layer 41a and the second electrode 42 may be formed through the same process, but this process may be merely illustrative and the ohmic-electrode layer 41a and the second electrode 42 may be formed through separate processes and may be formed of different materials.

Figure 14:
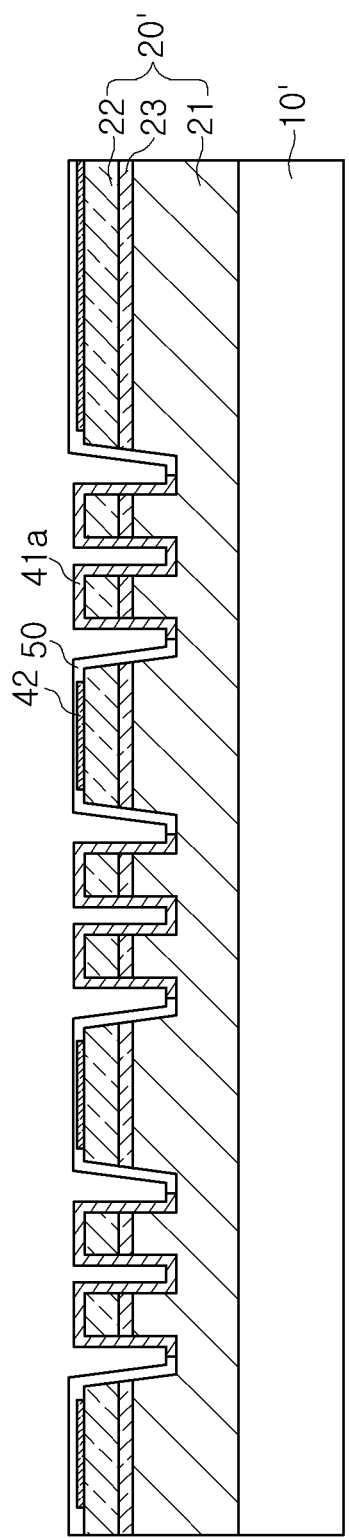

Thereafter, as illustrated in FIG. 14, the insulating part 50 covering the lateral surface of the contact hole H and the second electrode 42 is formed. The insulating part 50 may be formed of a material having electrical insulating properties, and in this case, preferably, a material having a low degree of light absorption may be used. For example, a silicon oxide ($SiO_2$), a silicon nitride ($Si_xN_y$), or a silicon oxynitride ($SiO_xN_y$) may be used.

Figure 15:
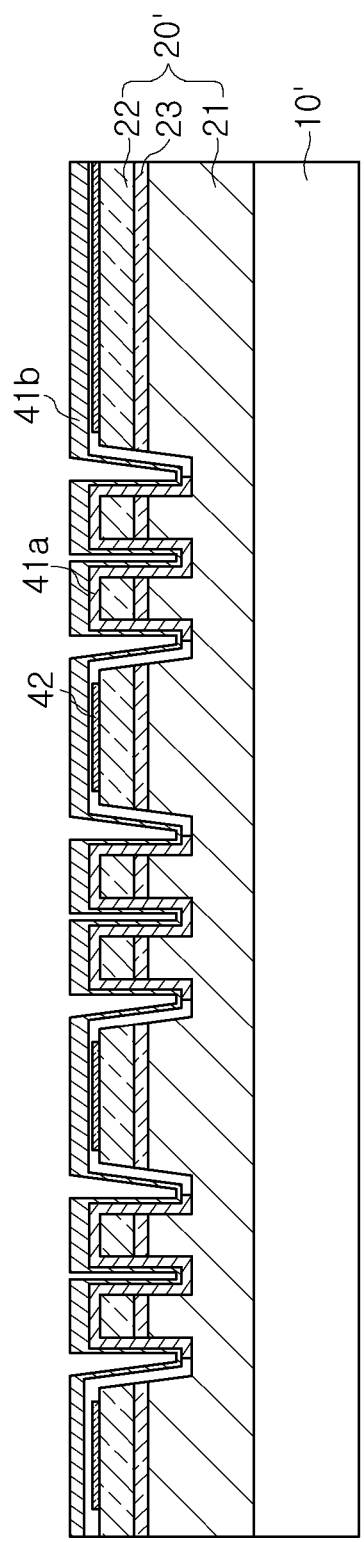

Thereafter, as illustrated in FIG. 15, the cover-electrode layer 41b is formed on the semiconductor laminate 20'. As illustrated, the cover-electrode layer 41b may be formed on the surface of the semiconductor laminate 20' but the inventive concepts is not limited thereto and the cover-electrode layer 41b may be formed to completely fill the contact hole H, like the cover-electrode layer 41b illustrated in FIG. 10.

Materials used to form the cover-electrode layer 41b may include at least one of silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si), germanium (Ge), and combinations thereof.

Figure 16:
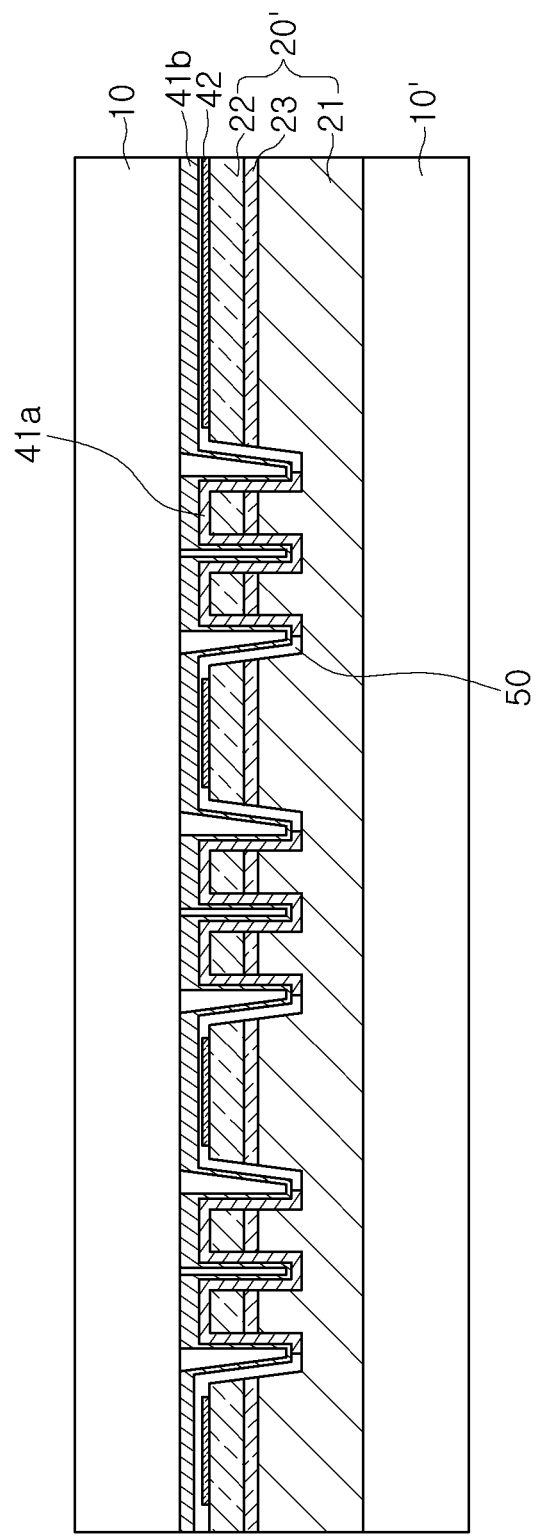

Thereafter, with reference to FIG. 16, the carrier substrate 10 is formed on the semiconductor laminate 20'. During this process, heat may be applied to an interface between the cover-electrode layer 41b and the carrier substrate 10 to allow the carrier substrate 10 to be joined to the semiconductor laminate 20' by the medium of the cover-electrode layer 41b. After this process is completed, the growth substrate 10' is removed to obtain the semiconductor light emitting device according to an example embodiment illustrated in FIGS. 1 through 3.

Figure 17A:
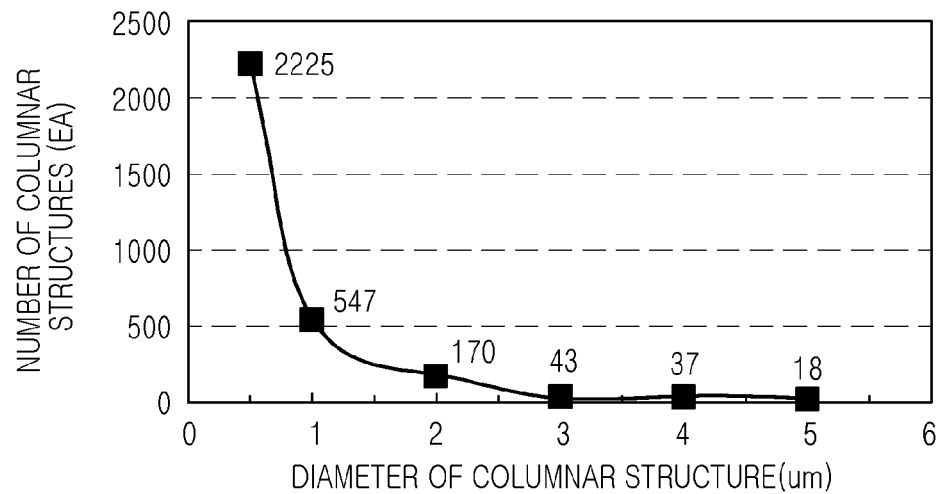
FIGS. 17A and 17B are graphs showing characteristics over changes in the diameters of a columnar structure, according to example embodiments.
Figure 17B:
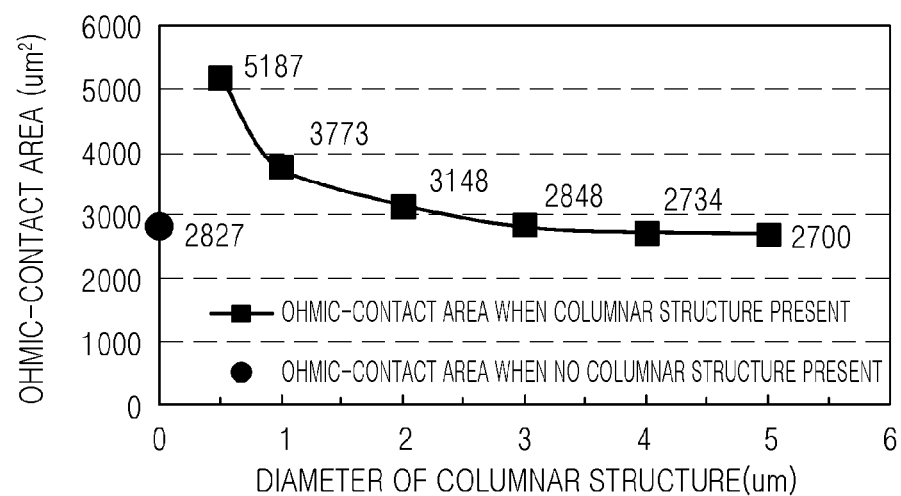

FIGS. 17A and 17B are graphs showing characteristics over changes in the diameters of a columnar structure through simulation.

Specifically, FIG. 17A is a graph showing the amount of columnar structures 30 that may be provided in each contact hole H according to a change in diameter d of the columnar structures 30, and FIG. 17B is a graph showing a change in an ohmic-contact area between the first conductivity-type semiconductor layer 21 and the ohmic-electrode layer 41a over a change in the diameter d of the columnar structure 30.

The simulation results provided herein are merely illustrative for providing a better understanding of the inventive concepts. Therefore, the light emitting device according to the example embodiments is not limited to simulation results or numerical values.

Referring to FIG. 17A, as the diameter d of the columnar structure 30 is reduced, the amount of columnar structures 30 that may be provided in a single contact hole H, is increased exponentially.

Referring to FIG. 17B, as the diameter d of the columnar structure is reduced, the ohmic-contact area between the ohmic-electrode layer and the first conductivity-type semiconductor layer was increased. In particular, based on the simulation results, in the case in which the diameter d of the columnar structure was equal to or less than 3 um, the ohmic-contact area was increased, in comparison to the case in which the columnar structure is not formed.

Also, as shown in Table 1 and Table 2 provided below, when the diameter d of the columnar structure is 4 um and 5 um, respectively, the ohmic-contact area is reduced in comparison to the case in which the columnar structure is not formed, but nonetheless, a driving voltage of the light emitting device is rarely increased in comparison to a driving voltage (Vref: 3.3202[V]) in a case in which the columnar structure is not formed.

TABLE 1

| Diameter of columnar structure (d): 4 um | |
| --- | --- |
| Distance between columnar structures (p) [um] | Driving voltage [V] |
| 4 | 3.3235 |
| 5 | 3.3235 |
| 6 | 3.3229 |
| 7 | 3.3230 |
| 8 | 3.3232 |
| 9 | 3.3230 |

TABLE 2

| Diameter of columnar structure (d): 5 um | |
| --- | --- |
| Distance between columnar structures (p) [um] | Driving voltage [V] |
| 4 | 3.3239 |
| 5 | 3.3227 |
| 6 | 3.3230 |
| 7 | 3.3232 |
| 8 | 3.3228 |
| 9 | 3.3231 |

As set forth above, according to the described example embodiments, a semiconductor light emitting device having enhanced reliability may be obtained. Also, a semiconductor light emitting device having enhanced light output may be obtained.

Advantages and effects of the inventive concepts are not limited to the foregoing content and any other technical effects not mentioned herein may be easily understood by a person skilled in the art from the foregoing description.

While the present application has been shown and described in connection with the example embodiments, it will be apparent to those skilled in the art that modifications and variations may be made without departing from the spirit and scope of the disclosure.

What is claimed is:
1. A semiconductor light emitting device comprising:
a light emitting structure including a first conductivity-type semiconductor layer, an active layer, and a second conductivity-type semiconductor layer;
at least one contact hole penetrating the second conductivity-type semiconductor layer and the active layer such that a region of the first conductivity-type semiconductor layer is exposed;
at least one columnar structure disposed in the exposed region of the first conductivity-type semiconductor layer within the at least one contact hole, the at least one columnar structure being obtained from a semiconductor laminate identical to the light emitting structure;

a first electrode disposed on the exposed region of the first conductivity-type semiconductor layer in which the at least one columnar structure is disposed, the first electrode being connected to the first conductivity-type semiconductor layer, the first electrode covering at least a portion of the at least one columnar structure; and a second electrode connected to the second conductivity-type semiconductor layer.

2. The semiconductor light emitting device of claim 1, wherein the at least one columnar structure includes the first conductivity-type semiconductor layer, the active layer, and the second conductivity-type semiconductor layer are sequentially laminated.

3. The semiconductor light emitting device of claim 1, wherein an area of a lateral surface of the at least one columnar structure is greater than an area of an upper surface of the at least one columnar structure.

4. A semiconductor light emitting device comprising:
a light emitting structure including a first conductivity-type semiconductor layer, an active layer, and a second conductivity-type semiconductor layer;
at least one contact hole penetrating the second conductivity-type semiconductor layer and the active layer such that a region of the first conductivity-type semiconductor layer is exposed;
at least one columnar structure disposed in the exposed region of the first conductivity-type semiconductor layer within the at least one contact hole;
a first electrode disposed on the exposed region of the first conductivity-type semiconductor layer in which the at least one columnar structure is disposed, the first electrode being connected to the first conductivity-type semiconductor layer, the first electrode covering at least a portion of the at least one columnar structure, the first electrode including
an ohmic-electrode layer directly in contact with the first conductivity-type semiconductor layer, and
a cover-electrode layer disposed on the ohmic-electrode layer; and
a second electrode connected to the second conductivity-type semiconductor layer.

5. The semiconductor light emitting device of claim 4, further comprising:
a carrier substrate disposed on the light emitting structure, wherein the cover-electrode layer extends to the lateral surface of the at least one contact hole so as to be interposed between the carrier substrate and the light emitting structure.

6. The semiconductor light emitting device of claim 5, wherein the cover-electrode layer is directly in contact with the carrier substrate to bond the light emitting structure and the carrier substrate.

7. The semiconductor light emitting device of claim 5, wherein the carrier substrate is a conductive substrate, and the carrier substrate is electrically connected to the cover-electrode layer.

8. The semiconductor light emitting device of claim 5, wherein the carrier substrate is electrically connected to the second electrode and is electrically insulated from the first electrode.

9. The semiconductor light emitting device of claim 5, further comprising:
an electrode lead-out portion penetrating the carrier substrate, and connecting to at least one of the first electrode and the second electrode.

10. The semiconductor light emitting device of claim 4, wherein the at least one columnar structure is disposed within a region in which the ohmic-electrode layer is disposed.

11. The semiconductor light emitting device of claim 4, wherein the cover-electrode layer includes a material selected from at least one of silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), titanium (Ti), tantalum (Ta), indium (In), silicon (Si) and germanium (Ge).

12. The semiconductor light emitting device of claim 11, wherein the cover-electrode layer includes a material selected from at least one of NiSn, CuSn, BiSn, AgSn and AuSn.

13. The semiconductor light emitting device of claim 4, wherein the at least one columnar structure is obtained from a semiconductor laminate identical to the light emitting structure.

14. The semiconductor light emitting device of claim 4, wherein the at least one columnar structure includes the first conductivity-type semiconductor layer, the active layer, and the second conductivity-type semiconductor layer are sequentially laminated.

15. The semiconductor light emitting device of claim 4, wherein an area of a lateral surface of the at least one columnar structure is greater than an area of an upper surface of the at least one columnar structure.

16. A semiconductor light emitting device comprising:
a light emitting structure including a first layer that includes at least one recessed portion, a second layer and a third layer;
at least one protruding structure protruding from the at least one recessed portion, the at least one protruding structure including a sequential stack of a portion of the first layer, the third layer and the second layer;
a first electrode disposed on the at least one recessed portion of the first layer, the first electrode covering at least a portion of the at least one protruding structure; and
a second electrode disposed on at least a portion of the second layer.

17. The semiconductor light emitting device of claim 16, wherein the at least one protruding structure has a cylindrical shape.

18. The semiconductor light emitting device of claim 16, wherein the first electrode comprises:
an ohmic-electrode layer disposed on the at least one protruding structure and directly contacting the first layer; and
a cover electrode layer disposed on the ohmic-electrode layer.

19. The semiconductor light emitting device of claim 16, wherein the portion of the second layer on which the second electrode is disposed, is adjacent to the at least one recessed portion and is in direct contact with the second layer.

20. The semiconductor light emitting device of claim 16, wherein the first layer and the second layer have different types of conductivity, and the third layer is an active layer disposed between the first layer and the second layer.

* * * * *